United States Patent
Minneman et al.

(10) Patent No.: US 9,124,060 B1
(45) Date of Patent: Sep. 1, 2015

(54) SYSTEM AND METHOD FOR GENERATING AND UTILIZING A VALID SWEEP VECTOR TO OBVIATE SPURIOUS DATA AND INCREASE SWEEP RATE IN AN AKINETIC PATH-BASED SWEPT LASER

(71) Applicant: INSIGHT PHOTONIC SOLUTIONS, INC., Lafayette, CO (US)

(72) Inventors: Michael Minneman, Lafayette, CO (US); Michael Crawford, Lafayette, CO (US); Jason Ensher, Lafayette, CO (US)

(73) Assignee: Insight Photonic Solutions, Inc., Lafayette, CO (US)

( * ) Notice: Subject to any disclaimer, the term of this patent is extended or adjusted under 35 U.S.C. 154(b) by 0 days.

(21) Appl. No.: 14/211,561

(22) Filed: Mar. 14, 2014

Related U.S. Application Data (60) Provisional application No. 61/786,960, filed on Mar. 15, 2013.

(51) Int. Cl.
*H01S 3/10* (2006.01)
*H01S 5/00* (2006.01)

(52) U.S. Cl.
CPC ................................. *H01S 5/0014* (2013.01)

(58) Field of Classification Search
CPC ....... H01S 5/06; H01S 5/0607; H01S 5/0614; H01S 5/068; H01S 5/06804; H01S 5/06808; H01S 5/0683; H01S 5/06835; H01S 5/0617; H01S 5/0687
USPC ..................... 372/20, 32, 38.02, 38.01, 29.01
See application file for complete search history.

(56) References Cited

U.S. PATENT DOCUMENTS

| 7,468,997 B2 | 12/2008 | Jayaraman | |
|---|---|---|---|
| 7,732,784 B2 | 6/2010 | Shimizu et al. | |
| 2003/0147442 A1* | 8/2003 | Larson et al. | 372/50 |

(Continued)

FOREIGN PATENT DOCUMENTS

WO WO 2013/016249 * 1/2013

OTHER PUBLICATIONS

Google search, p. 1-2, Apr. 13, 2015.*

(Continued)

*Primary Examiner* — Colleen A Matthews
*Assistant Examiner* — Delma R Forde
(74) *Attorney, Agent, or Firm* — Renner, Otto, Boisselle & Sklar, LLP (57) ABSTRACT

A system and method for triggering data acquisition in a semiconductor laser system including outputting electromagnetic energy from the semiconductor laser over a range of wavelengths according to a signaling path. The signaling path includes a plurality of discrete data inputs to the semiconductor laser for outputting electromagnetic energy over a range of wavelengths and the signaling path includes one or more perturbances in transitioning from one wavelength to another wavelength along the signaling path. A series of triggering signals are generated for input to a measurement system by the semiconductor laser. The electromagnetic energy output from the semiconductor laser is detected based on the series of triggering signals. The detected electromagnetic energy is compared with a valid data vector, wherein the valid data vector includes one or more criteria and/or values that is used to differentiate valid data from invalid data corresponding to the detected electromagnetic energy.

25 Claims, 5 Drawing Sheets

(56) References Cited

U.S. PATENT DOCUMENTS

2013/0044312 A1* 2/2013 Minneman et al. ............ 356/51
2013/0046499 A1* 2/2013 Minneman et al. ............ 702/85
2013/0223461 A1* 8/2013 Ensher et al. ............ 372/38.02

OTHER PUBLICATIONS

Fujiwara et al., "140-nm Quasi-Continuous Fast Sweep Using SSG-DBR Lasers", IEEE Photonics Technology Letters, vol. 20, No. 12, Jun. 15, 2008, pp. 1015-1017.

Derickson et al., "SGDBR single-chip wavelength tunable lasers for swept source OCT" in *Coherence Domain Optical Methods and Optical Coherence Tomography in Biomedicine XII*, edited by Izatt et. al., Proceedings of SPIE, vol. 6847 (SPIE, Bellingham, WA), 2008, 11 pages.

George et al., "High-Speed Concatenation of Frequency Ramps Using Sampled Grating Distributed Bragg Reflector Laser Diode Sources for OCT Resolution Enhancement" in Coherence Domain Optical Methods and Optical Coherence Tomography in Biomedicine XIV, edited by Izatt et al., Proceedings of SPIE, vol. 7554 (SPIE, Bellingham, WA), 2010, 8 pages.

O'Connor et al., "100 kHz Axial Scan Rate Swept-Wavelength OCT using Sampled Grating Distributed Bragg Reflector Lasers" in *Coherence Domain Optical Methods and Optical Coherence Tomography in Biomedicine XIII*, edited by Izatt et al., Proceedings of SPIE, vol. 7168 (SPIE, Bellingham, WA), 2009, 8 pages.

Kakuma et al., "24 mm depth range discretely swept optical frequency domain imaging in dentistry", Proc. SPIE, vol. 7162, 2009, 8 pages.

Amano et al., "Optical frequency-domain reflectometry with a rapid wavelength-scanning superstructure-grating distributed Bragg reflector laser", Applied Optics, vol. 44, No. 5, Feb. 10, 2005, pp. 808-816.

Kakuma et al., "Optical imaging of hard and soft dental tissues using discretely swept optical frequency domain reflectometry optical coherence tomography at wavelengths from 1560 to 1600 nm", Journal of Biomedical Optics, vol. 13(1), Jan./Feb. 2008, 6 pages.

* cited by examiner

SYSTEM AND METHOD FOR GENERATING AND UTILIZING A VALID SWEEP VECTOR TO OBVIATE SPURIOUS DATA AND INCREASE SWEEP RATE IN AN AKINETIC PATH-BASED SWEPT LASER

RELATED APPLICATIONS

This application is a Non-Provisional of the U.S. Application No. 61/786,960 filed on Mar. 15, 2013, which is hereby incorporated herein by reference in its entirety.

TECHNICAL FIELD

The present invention relates generally to a system and a method for generating and utilizing sweep valid signal to obviate spurious data and increase sweep rate in an akinetic path-based swept laser.

BACKGROUND

A tunable laser is one in which the wavelength may be varied over time in a predictable manner. In the past, conventional tunable lasers have utilized mechanical movement as the basis for wavelength tuning. Such mechanical movement may be induced by a number of devices including, for example: a grating that may be tilted to generate different wavelength reflection into the laser cavity; a mircoelectro-mechancial (MEMs) device that deflects to generate the wavelength change; and a filter that may be tilted to generate the wavelength change.

A new category of tunable laser based on an all-electronic tuning mechanism is now being utilized, which can tune without mechanical movement. These akinetic lasers have many useful qualities, including high speed, flexible tuning, and good optical quality. Lasers of this type have so far all been based on a semiconductor structure similar to the sample grating distributed Bragg reflector (SG-DBR), or sampled grating distributed Bragg reflector.

SUMMARY

The tuning of these akinetic devices is not based on a single monotonic or linear sweep of a constant parameter (as in kinetic lasers), but rather a discontinuous series of continuous paths of one or more control parameters. When the laser is transitioned from one path to another, it is common for the laser to take some time to make this transition. If the sweep is very slow, these slight perturbances in the transition are not pertinent. During high-speed sweeps, though, knowing when and how long these perturbances occur can be critical.

To interact with a measurement system that may be interrogating the optical signal response based on the output of the laser, in kinetic lasers the measurement is generally made in equal-time intervals and any difference from perfect linearity of optical frequency vs. time is made using post processing and a separate signal indicating equal optical frequency intervals. Alternatively, an optical circuit (e.g., a Mach-Zehnder interferometer), which outputs signals on equally-spaced optical frequency intervals, is used to trigger the measurement hardware for kinetic laser system. Neither of these approaches will resolve the perturbances issue with the akinetic laser.

One aspect of the present disclosure relates to an electronic signal being generated during the sweep of the laser when the electronic signal corresponds to a is correct wavelength output, and importantly this signal is used to trigger the measurement hardware. This trigger signal includes outputting the trigger signal during the perturbances or non-linearities occurring during the sweep from wavelength to another wavelength. In one embodiment, provision is made to allow digital communication to the laser control hardware, whereby the measurement hardware may query a data valid vector that indicates the distinction between the valid data and the invalid data. In the measurement hardware, this vector is used post-facto so that the invalid data points may be discarded before measurement analysis is performed.

Alternatively or additionally, the step of comparing is performed after the electromagnetic energy has been detected over the range of wavelengths.

Alternatively or additionally, further including processing valid data points in the detected electromagnetic energy to characterize the detected electromagnetic energy.

Alternatively or additionally, further including storing valid data points associated with the detected electromagnetic energy and discarding invalid data points.

Alternatively or additionally, the signaling path corresponds to a prescribed signaling path based on one or more known perturbances in transitioning from one wavelength to another wavelength.

Alternatively or additionally, a prescribed signaling path is selected to minimize traversal of a quantity of known perturbances in discretely sweeping over the range of wavelengths.

Alternatively or additionally, a prescribed signaling path is selected to minimize an amplitude associated with a quantity of known perturbances in discretely sweeping over the range of wavelengths.

Alternatively or additionally, the signaling path includes discrete data inputs for outputting electromagnetic energy within a range of wavelengths from about 1502 to about 1604 nanometers.

Alternatively or additionally, the signaling path includes discrete data inputs for outputting electromagnetic energy within a range of wavelengths from about 1250 to about 1400 nanometers.

Alternatively or additionally, the signaling path includes discrete data inputs for outputting electromagnetic energy within a range of wavelengths from about 1000 to is about 1100 nanometers.

Alternatively or additionally, the discrete data inputs include at least one of a front mirror current and a back mirror current.

Alternatively or additionally, the discrete data inputs further includes at least one of a phase current and a semiconductor optical amplitude.

Another aspect of the disclosure relates to a semiconductor laser system, the system including: a semiconductor laser configured to output electromagnetic energy discretely along a signaling path over a range of wavelengths, and to generate a series of triggering signals, wherein the series of triggering signals include a constant period between each triggering signal in the series and the semiconductor laser generates a series of valid signal indicators indicative of when the outputted electromagnetic energy is not undergoing one or more perturbance; a measurement system configured to receive the series of triggering signals and the series of valid signal indicators and the measurement system is further configured to detect the electromagnetic energy output from the semiconductor laser based on the received series of valid signal indicators; and a controller configured to output discrete data inputs to the semiconductor laser in order for the semiconductor laser to output electromagnetic energy in discrete wavelength steps along the signaling path, the controller is configured to coordinate electronic storage of one or more values associate with the detected electromagnetic energy, and the controller is further configured to compare the detected electromagnetic energy with a valid data vector to characterize the detected electromagnetic energy, wherein the valid data vector includes one or more criteria and/or values that is used to differentiate valid data from invalid data corresponding to the detected electromagnetic energy.

Alternatively or additionally, the valid data vector is stored in a memory coupled to the controller.

Alternatively or additionally, the data vector includes one or more criterion that constitutes a valid detected electromagnetic data.

Alternatively or additionally, the controller compares the detected electromagnetic energy after the semiconductor sweeps over the range of wavelengths.

Alternatively or additionally, further including a processor coupled to the memory, is wherein processor processes valid data points in the detected electromagnetic energy to characterize the detected electromagnetic energy.

Alternatively or additionally, the processor causes storing valid data points associated with the detected electromagnetic energy and discarding invalid data points in the memory.

Alternatively or additionally, the signaling path corresponds to a prescribed signaling path based on one or more known perturbances in transitioning from one wavelength to another wavelength.

Alternatively or additionally, the measurement system is configured to receive the series of trigger signals during an occurrence of one or more perturbances in the outputted electromagnetic energy.

Alternatively or additionally, the measurement system includes a detector configured to detect the electromagnetic energy output from the semiconductor laser based on the series of triggering signals.

Alternatively or additionally, the signaling path corresponds to a prescribed signaling path based on one or more known perturbances in transitioning from one wavelength to another wavelength.

Alternatively or additionally, the prescribed signaling path is selected to minimize traversal of a quantity of known perturbances in discretely sweeping over the range of wavelengths.

Alternatively or additionally, the prescribed signaling path is selected to minimize an amplitude associated with a quantity of known perturbances in discretely sweeping over the range of wavelengths.

Alternatively or additionally, the discrete data inputs include at least one of a front mirror current and a back mirror current.

Alternatively or additionally, the discrete data inputs further includes at least one of a phase current and a semiconductor optical amplitude.

Alternatively or additionally, the measurement system is configured to receive the series of trigger signals during an occurrence of one or more perturbances in the outputted electromagnetic energy.

Alternatively or additionally, further including a processor coupled to the controller, wherein the processor is configured process the one or more stored values to obtain valid data information over the range of wavelengths by processing only data values having a corresponding valid signal indicator.

Another aspect of the disclosure relates to a method for triggering data acquisition in a semiconductor laser having one or more known perturbances in a signaling path, the method including: outputting electromagnetic energy from the semiconductor laser over a range of wavelengths according to a signaling path, wherein the signaling path includes a plurality of discrete data inputs to the semiconductor laser for outputting electromagnetic energy over a range of wavelengths and the signaling path includes one or more perturbances in transitioning from one wavelength to another wavelength along the signaling path; generating a series of triggering signals for input to a measurement system by the semiconductor laser, wherein the series of triggering signals include a constant period between each triggering signal in the series of triggering signals and the triggering signal is received at the measurement hardware during an occurrence of one or more perturbances in the outputted electromagnetic energy; detecting the electromagnetic energy output from the semiconductor laser based on the series of valid signal indicators; storing one or more values associated with the detected electromagnetic energy associated with the range of wavelengths; and comparing the detected electromagnetic energy with a valid data vector to characterize the detected electromagnetic energy, wherein the valid data vector includes one or more criteria and/or values that is used to differentiate valid data from invalid data corresponding to the detected electromagnetic energy.

A number of features are described herein with respect to embodiments of the invention. It will be appreciated that features described with respect to a given embodiment also may be employed in connection with other embodiments.

The invention comprises the features described herein, including the description, the annexed drawings, and, if appended, the claims, which set forth in detail certain illustrative embodiments. These embodiments are indicative, however, of but a few of the various ways in which the principles of the invention may be employed.

DESCRIPTION

Figure 1:
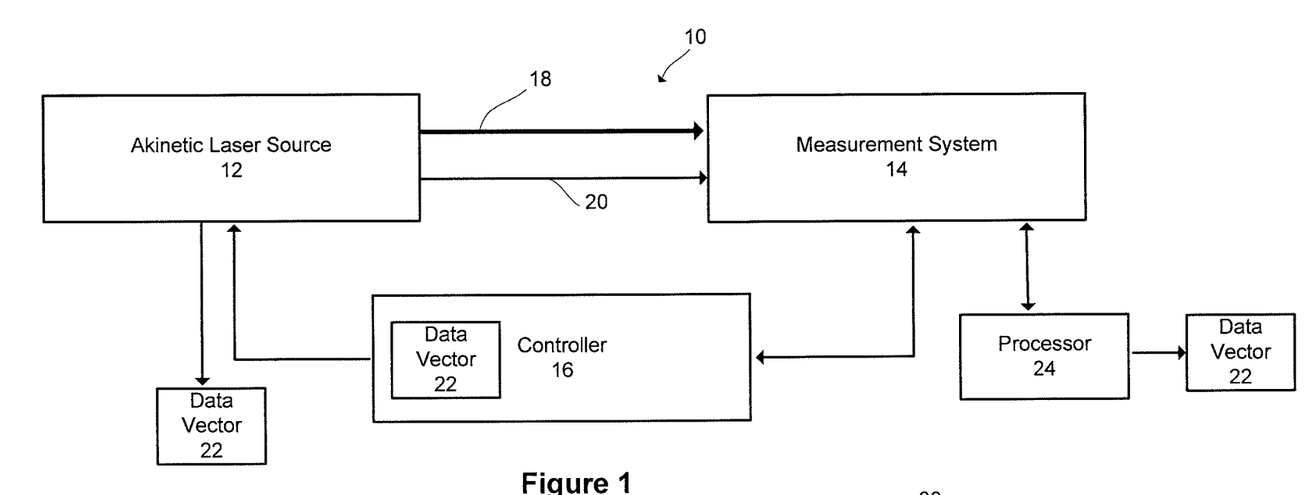
FIG. 1 illustrates an exemplary system in accordance with aspects of the present disclosure.

Referring to FIG. 1, an optical testing system 10 (also referred to as optical measurement system) is illustrated. The optical testing system 10 includes an electromagnetic energy source 12, a measurement system 14, and a controller 16. The system 10 may be used to perform a variety of functions including, for example, characterizing a device under test; optical coherence tomography (OCT) and optical frequency domain reflectometry (OFDR) applications and the like.

The electromagnetic energy source 12 may be an akinetic laser. The akinetic laser may be a semiconductor laser. For example, the electromagnetic energy source 12 may be a Semiconductor Monolithic Tunable Laser Source (SMTLS).

SMTLS have a characteristic sweep that is very short in time. However, the sweep may include is potentially impactful non-linearities in the wavelength sweep. The energy source 12 provides a laser beam (sometimes referred to as light but may be other electromagnetic energy) 18 as incident electromagnetic energy to a specimen (not shown) and detected by the measurement system 14. It will be appreciated that other types of electromagnetic sources may be used and fall within the spirit and scope of the present disclosure.

Figure 2:
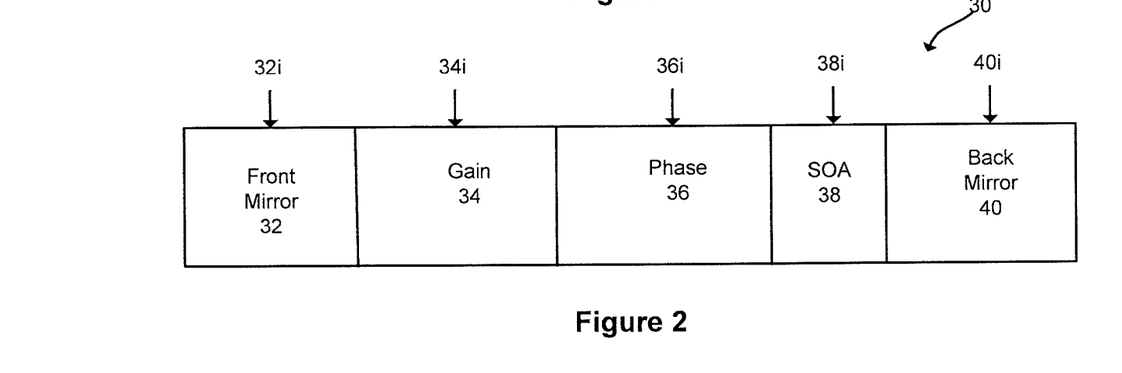
FIG. 2 illustrates an exemplary laser source in accordance with aspects of the present disclosure.

Referring to FIG. 2, an exemplary SMTLS 30 is shown. The SMLTS 30 includes the following sections: a front mirror section 32, a gain section 34, a phase section 36, a semiconductor optical amplifier (SOA) section 38 and a back mirror section 40. Each of these sections is configured to receive input signals (32i, 34i, 36i, 38i and 40i, where "i" is indicative of "input". Generally, the controller 16 is configured to output the desired inputs to the various sections of the SMTLS 30 in order to control operation of the SMTLS. Typically, the controller 16 outputs currents and/or voltage signals to the various inputs (e.g., 32i, 34i, 36i, 38i, and 40i) to change one or more characteristics of electromagnetic radiation output from the SMTLS.

SMTLSs have wavelength regions associated with combinations of back mirror drive (e.g., 40i) and front mirror drive (e.g., 32i) currents. The complexity of the wavelength versus current map is shown in the FIG. 3. SMTLS devices were defined and developed to allow one of an array of specific wavelengths to be output, for example allowing selection of any one of the standard (ITU) wavelengths.

Work has been done in the past to allow fast switching of an SMTLS laser from one wavelength to another wavelength, anywhere in the tuning range of the laser, as discussed in U.S. Patent Application Publication 2009/0059972. Prior art involves using knowledge of the initial and final wavelength, and the currents associated with each wavelength, as well as feedback control systems to quickly lock the laser to its destination wavelength. This methodology is useful for applications in telecommunications that require changes from one wavelength to another, destination wavelength.

In other applications such as swept-wavelength test of telecommunications components, remote sensing and optical coherence tomography, there are many is motivations to operate the laser not as a wavelength-switching device, but rather as a wavelength-sweeping device. A wavelength sweep, as used in this disclosure, refers to a (or step-wise continuous) movement over time from one wavelength to another, preferably in a linear, monotonic fashion.

Figure 3:
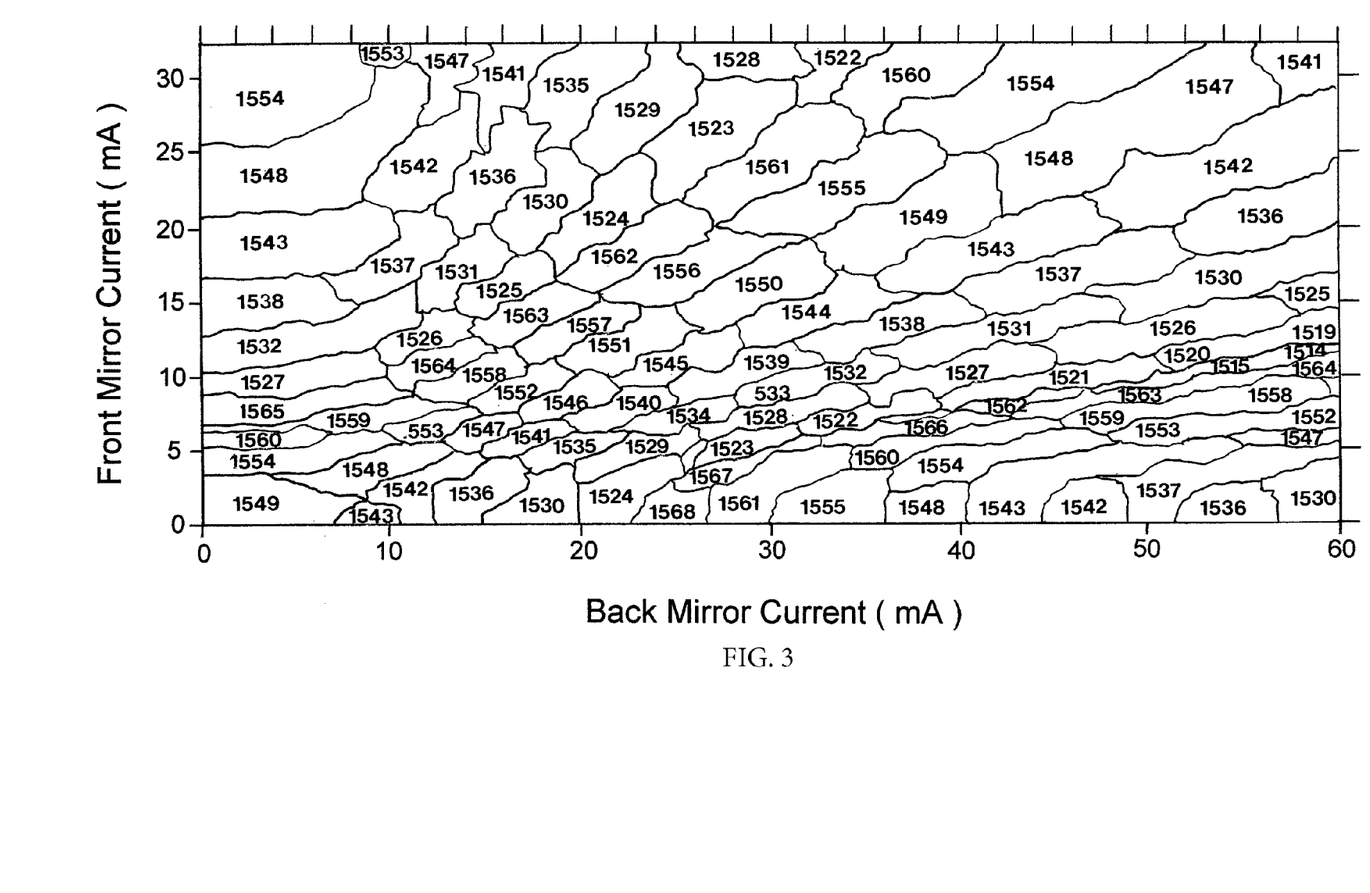
FIG. 3 is an exemplary chart of a Tuning Map-Wavelength vs. Mirror Excitation with front mirror current (mA) versus back mirror current (mA).

The first challenge to sweeping a SMTLS is to determine how to tune the multi-section laser structure in a continuous manner. As discussed above, each section of the laser is controlled by a parameter such as current or voltage, leading to a complex multi-variable control space. By measuring the wavelength of the laser at a plurality of tuning currents (such as the front mirror, the back mirror and phase section of the laser) a continuous signaling path can be determined that traverses from lower wavelength to higher wavelength, as illustrated in FIG. 3. Tuning paths are illustrated by the lines labeled (a-i) in FIG. 4. Starting on line labeled (a), a set of front and back mirror currents may be selected that tunes the laser continuously in wavelength from high wavelength to successively lower wavelengths along lines (b), (c), etc. to line (h).

Figure 4:
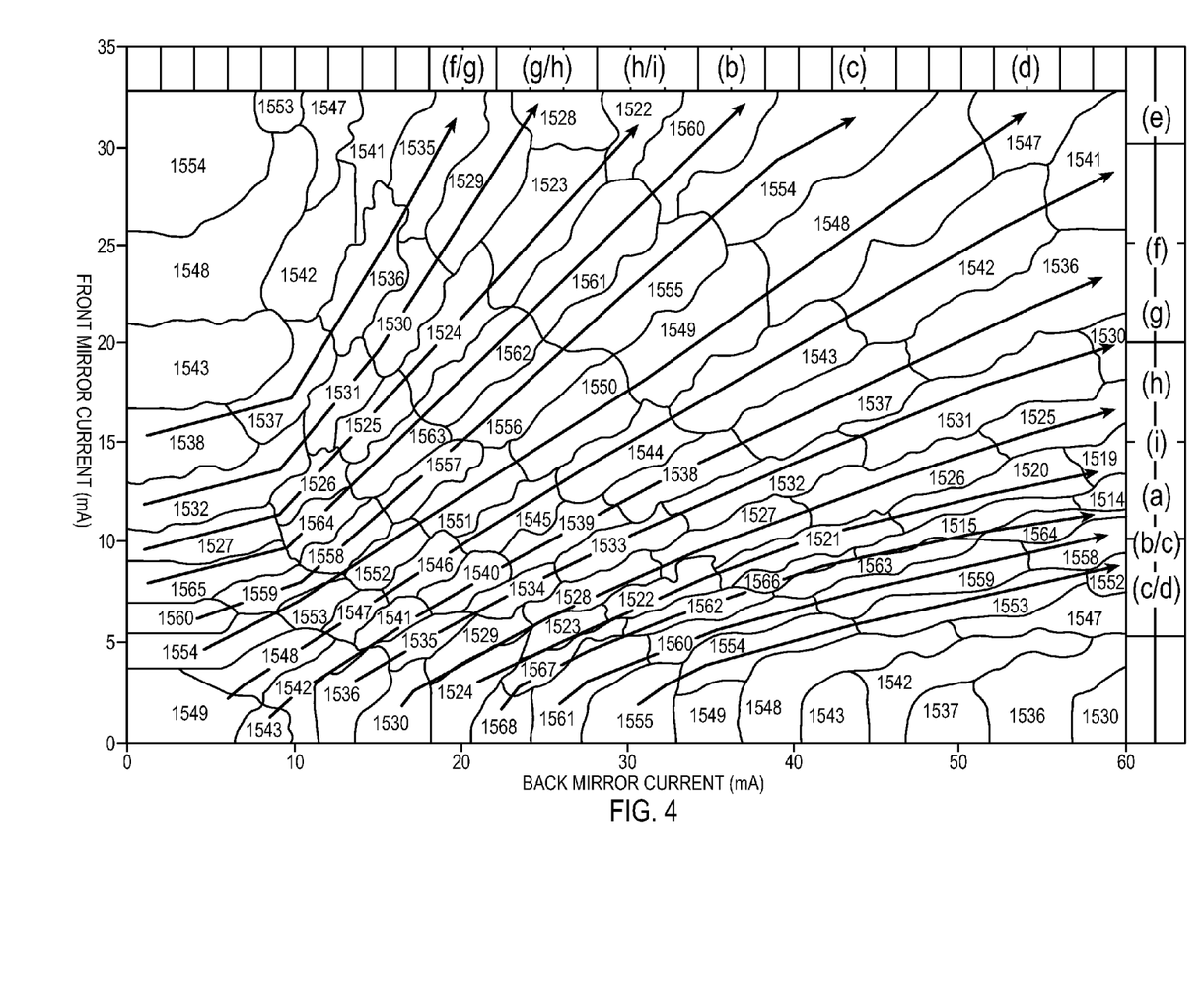
FIG. 4 is an exemplary Tuning Map with Rough Mirror Sweep Paths plotted on the exemplary chart of FIG. 3.

Each enclosed region in FIG. 4 represents a mode of the laser. At the boundary of each region, a mode hop occurs. As an example a mode hop in an SMTLS laser may be 350 picometers (pm) long. The magnitude of the mode hop may be controlled with the phase current. However, changing the phase current alters the details of the wavelength map in FIG. 4. Preventing wavelength discontinuities in an SMTLS requires understanding how to adjust multiple control parameters across the wavelength sweep of the SMTLS.

A signaling path includes a plurality of discrete data inputs (e.g., any combination of front mirror and corresponding back mirror, phase, SOA and/or gain currents and/or voltages) to the semiconductor laser for outputting electromagnetic energy over a range of wavelengths. As discussed above, when traversing from one mode to another the signaling path may include one or more perturbances (also referred to herein as non-linearities) in transitioning from one wavelength to another wavelength along the signaling path. The signaling path may include discrete data inputs for outputting electromagnetic energy within a range of wavelengths from about 1502 to about 1604 nanometers, for example. Other exemplary ranges include: from about 1250 to 1400 is nanometers; and from about 1000 to 1100 nanometers.

In one embodiment, the signaling path may correspond to a prescribed signaling path based on one or more known perturbances in transitioning from one wavelength to another wavelength. In another embodiment, a prescribed signaling path is selected to minimize traversal of a quantity of known perturbances in discretely sweeping over the range of wavelengths. In yet another embodiment, a prescribed signaling path is selected to minimize amplitude associated with a quantity of known perturbances in discretely sweeping over the range of wavelengths.

As set forth above, the electromagnetic energy source 12 provides electromagnetic energy over a range of wavelengths. The range may include a number of distinct wavelengths that are between respective wavelength values at respective opposite ends of the range. The wavelength range may be the visible range of wavelengths or part of the visible range, may be in the ultraviolet, infrared, or some other range, or may be a combination or part or all of the mentioned and/or other ranges. The range may be continuous or may include discontinuous portions. One of ordinary skill in the art will readily appreciate that the disclosure may be used with other wavelengths and wavelength ranges.

One aspect of the present disclosure is for the energy source 12 to provide triggering signals 20 to the measurement system to increase sweep rate and reduce spurious data. The triggering signals 20 are a series of triggering signals for input to a measurement system. The series of triggering signals include a constant period between each triggering signal in the series of triggering signals 20. The triggering signals 20 are received at the measurement system 14 at a constant rate even during an occurrence of one or more perturbances in the outputted electromagnetic energy.

Figure 5:
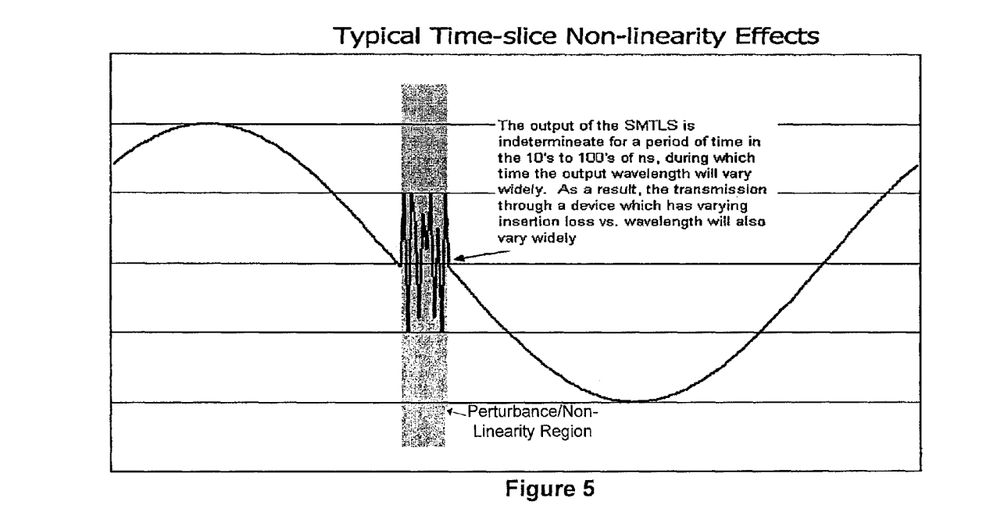
FIG. 5 is an exemplary discontinuity (non-linearity) in accordance with aspects of the present disclosure.

An exemplary perturbance and/or discontinuity is illustrated in FIG. 5. In FIG. 5, instead of smooth transition from the one wavelength to another wavelength, the measurement system 14 detects one or more non-linearities that are not representative of the actual results at those predicted wavelengths. In addition, there are potentially large amplitude variations that can occur during these non-linearities in wavelength (due to relatively high change in loss versus wavelength of a measured device in the vicinity of the non-linearity), which can cause the measurements immediately following the non-linearity to be incorrect due to explicit or implicit filtering of the signal. For example, the signal may jump to a much larger signal during a non-linearity, and even after the non-linearity, the signal may not have settled back to the nominal level due to filter settling time.

To account for these situations, one aspect of the present disclosure is to provide the triggering signal 20 to the measurement system 14 at a constant period throughout the one or more perturbances. Since the energy source 12 is mapped according space of inputs to the energy source, an approximation for each of the perturbations is available and may be stored in a controller of the energy source 12 and/or controller 16, for example. Such information may be stored in a data vector, which may include one or more criteria for valid data and/or expected valid data values for the range of wavelengths to be tested, for example.

The data vector may be stored in storage device (e.g., memory) integrated with the controller 16 and/or coupled to the controller 16, for example. As illustrated in FIG. 1, the data vector 22 may be coupled to the controller 16 directly and/or through a processor 24. The processor 24 is preferably configured to process information detected by the measurement system 14. Such processing may occur in real-time and/or post-facto processing (e.g., after the occurrence of a sweep of a range of wavelengths).

The data vector 22 may be used post-processing to indicate when a valid wavelength was output by the energy source 12 and thus, the detected signal should be used for characterization purposes. One advantage of this embodiment is that conventional systems require a continuous stream of trigger signals with constant periods and duty cycles. In this embodiment, the measurement system 14 detects data for all points occurring along the signaling path and post-processing is used to characterize the detected electromagnetic energy. For example, the detected electromagnetic energy is compared with a valid data vector to characterize the detected electromagnetic energy. The valid data vector 22 includes one or more criteria and/or values that are used to differentiate valid data from invalid data corresponding to the detected electromagnetic energy.

Figure 6:
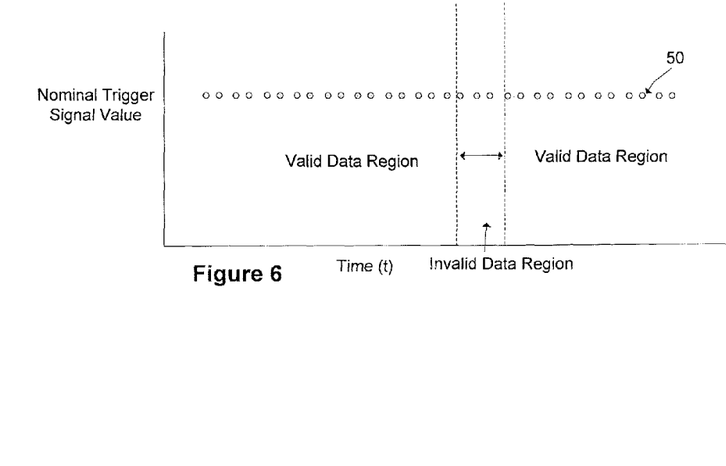
FIG. 6 is an exemplary signaling chart that illustrates generation of the triggering signals and an indication regarding a valid data vector in accordance with aspects of the present disclosure.

FIG. 6 illustrates an exemplary triggering signal stream 50. Likewise FIG. 6 also illustrates regions having valid data and invalid data. Such regions and values may be stored in the valid data vector 22. In order to interact with measurement hardware, measurements are generally made in equal-time intervals. For example, high-speed ADC systems often utilize a pipeline scheme that requires triggers that are nearly constant in frequency with a 50% duty cycle. Post-facto processing may then be performed on the detected signal such that only data having a prescribed value and/or meeting specific criterion are presumed to be valid data points and data points not having the appropriate value and/or not meeting the criterion are considered to have invalid data and is not used in measurement and/or post processing calculations, for example.

In the above embodiments, the series of triggers are all generated in precisely-timed intervals. A perturbance is always, then by definition, a time span of an integral number of these equal intervals. This allows the measurement system 14 to perform measurements at these equal intervals, which can have beneficial impacts on measurement system noise and other performance parameters.

Figure 7:
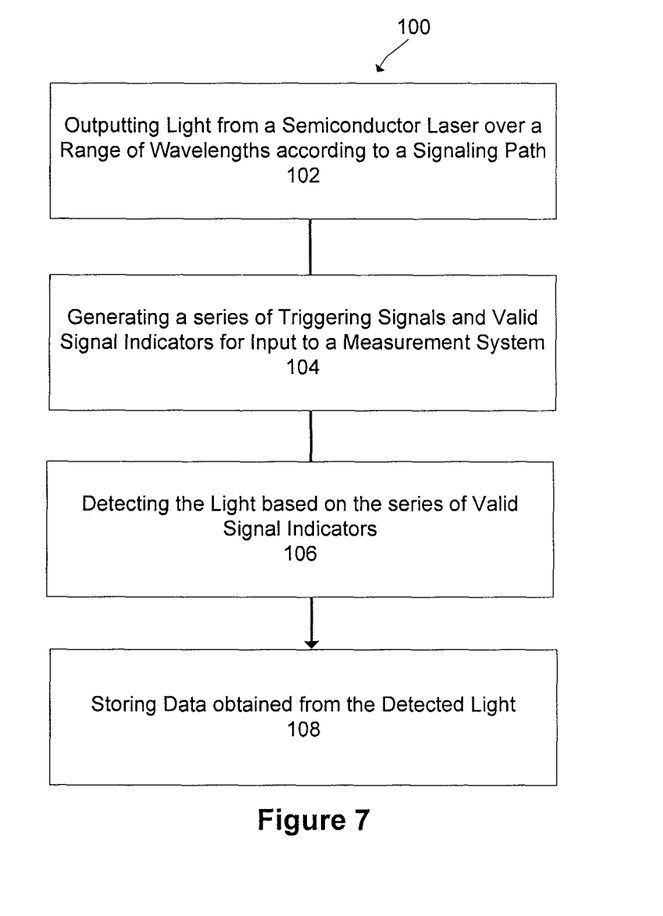
FIG. 7 is an exemplary method in accordance with aspects of the present disclosure.

An exemplary method 100 for triggering data acquisition in a semiconductor laser having one or more known perturbances in a signaling path is illustrated in FIG. 7. At block 102, the method includes outputting electromagnetic energy from the semiconductor laser over a range of wavelengths according to a signaling path. The signaling path includes a plurality of discrete data inputs to the semiconductor laser for outputting electromagnetic energy over a range of wavelengths and the signaling path includes one or more perturbances in transitioning from one wavelength to another wavelength along the signaling path.

At block 104, a series of triggering signals is generated for input to a measurement system by the semiconductor laser. The series of triggering signals includes a constant period between each triggering signal in the series of triggering signals and the triggering signal is received at the measurement hardware during an occurrence of one or more perturbances in the outputted electromagnetic energy.

At block 106, electromagnetic energy output from the semiconductor laser is is detected based on the series of valid signal indicators. At block 108, the one or more values associated with the detected electromagnetic energy is stored for processing.

At block 110, the detected electromagnetic energy is compared with a valid data vector to characterize the detected electromagnetic energy. The valid data vector includes one or more criteria and/or values that are used to differentiate valid data from invalid data corresponding to the detected electromagnetic energy. Preferably, the step of comparing occurs after data associated with a partial and/or complete sweep of ranges has occurred.

Although the invention is shown and described with respect to illustrative embodiments, it is evident that equivalents and modifications will occur to those persons skilled in the art upon the reading and understanding hereof. The present invention includes all such equivalents and modifications and is limited only by the scope of the claims if appended hereto.

What is claimed is:

1. A method for triggering data acquisition in a semiconductor laser having one or more known perturbances in a signaling path, the method comprising:
outputting electromagnetic energy from the semiconductor laser over a range of wavelengths according to a signaling path, wherein the signaling path includes a plurality of discrete data inputs to the semiconductor laser for outputting electromagnetic energy over a range of wavelengths and the signaling path includes one or more perturbances in transitioning from one wavelength to another wavelength along the signaling path;
generating a series of triggering signals for input to a measurement system by the semiconductor laser, wherein the series of triggering signals include a constant period between each triggering signal in the series of triggering signals and the triggering signal is received at the measurement hardware during an occurrence of one or more perturbances in the outputted electromagnetic energy;
detecting the electromagnetic energy output from the semiconductor laser based on the series of triggering signals;
storing one or more values associated with the detected electromagnetic energy associated with the range of wavelengths; and
comparing the detected electromagnetic energy with a valid data vector to characterize the detected electromagnetic energy, wherein the valid data vector includes one or more criteria and/or values that is used to differentiate valid data from invalid data corresponding to the detected electromagnetic energy.

2. The method of claim 1, wherein the step of comparing is performed after the electromagnetic energy has been detected over the range of wavelengths.

3. The method of claim 2, further including processing valid data points in the detected electromagnetic energy to characterize the detected electromagnetic energy.

4. The method of claim 3, further including storing valid data points associated with the detected electromagnetic energy and discarding invalid data points.

5. The method of claim 1, wherein the signaling path corresponds to a prescribed signaling path based on one or more known perturbances in transitioning from one wavelength to another wavelength.

6. The method of claim 5, wherein a prescribed signaling path is selected to minimize traversal of a quantity of known perturbances in discretely sweeping over the range of wavelengths.

7. The method of claim 5, wherein a prescribed signaling path is selected to minimize an amplitude associated with a quantity of known perturbances in discretely sweeping over the range of wavelengths.

8. The method of claim 1, wherein the signaling path includes discrete data inputs for outputting electromagnetic energy within at least one of:
   a range of wavelengths from about 1502 to about 1604 nanometers;
   a range of wavelengths from about 1250 to about 1400 nanometers; or
   a range of wavelengths from about 1000 to about 1100 nanometers.

9. The method of claim 1, wherein the discrete data inputs include at least one of a front mirror current and a back mirror current.

10. The method of claim 9, wherein the discrete data inputs further includes at least one of a phase current and a semiconductor optical amplitude.

11. A semiconductor laser system, the system comprising:
   a semiconductor laser configured to output electromagnetic energy discretely along a signaling path over a range of wavelengths, and to generate a series of triggering signals, wherein the series of triggering signals include a constant period between each triggering signal in the series and the semiconductor laser generates a series of triggering valid signal indicators indicative of when the outputted electromagnetic energy is not undergoing one or more perturbance;
   a measurement system configured to receive the series triggering signals and the series of valid signal indicators and the measurement system is further configured to detect the electromagnetic energy output from the semiconductor laser based on the received series of triggering signals; and
   a controller configured to output discrete data inputs to the semiconductor laser in order for the semiconductor laser to output electromagnetic energy discretely along the signaling path, the controller is configured to coordinate electronic storage of one or more values associate with the detected electromagnetic energy, and the controller is further configured to compare the detected electromagnetic energy with a valid data vector to characterize the detected electromagnetic energy, wherein the valid data vector includes one or more criteria and/or values that is used to differentiate valid data from invalid data corresponding to the detected electromagnetic energy.

12. The system of claim 11, wherein the valid data vector is stored in a memory coupled to the controller.

13. The system of claim 12, wherein the data vector includes one or more criterion that constitutes a valid detected electromagnetic data.

14. The system of claim 12, wherein the controller compares the detected electromagnetic energy after the semiconductor sweeps over the range of wavelengths.

15. The system of claim 12, further including a processor coupled to the memory, wherein the processor processes valid data points in the detected electromagnetic energy to characterize the detected electromagnetic energy.

16. The system of claim 15, wherein the processor causes storing valid data points associated with the detected electromagnetic energy and discarding invalid data points in the memory.

17. The system of claim 11, wherein the measurement system is configured to receive the series of trigger signals during an occurrence of one or more perturbances in the outputted electromagnetic energy.

18. The system of claim 11, wherein the measurement system includes a detector configured to detect the electromagnetic energy output from the semiconductor laser based on the series of triggering signals.

19. The system of claim 11, wherein the signaling path corresponds to a prescribed signaling path based on one or more known perturbances in transitioning from one wavelength to another wavelength.

20. The system of claim 19, wherein the prescribed signaling path is selected to minimize traversal of a quantity of known perturbances in discretely sweeping over the range of wavelengths.

21. The system of claim 20, wherein the prescribed signaling path is selected to minimize an amplitude associated with a quantity of known perturbances in discretely sweeping over the range of wavelengths.

22. The system of claim 11, wherein the discrete data inputs include at least one of a front mirror current and a back mirror current.

23. The system of claim 11, wherein the discrete data inputs further includes at least one of a phase current and a semiconductor optical amplitude.

24. The system of claim 23, wherein the measurement system is configured to receive the series of trigger signals during an occurrence of one or more perturbances in the outputted electromagnetic energy.

25. The system of claim 24, further including a processor coupled to the controller, wherein the processor is configured process the one or more stored values to obtain valid data information over the range of wavelengths by processing only data values having a corresponding valid signal indicator.

* * * * *